United States Patent
Yen et al.

(10) Patent No.: US 8,330,162 B2
(45) Date of Patent: Dec. 11, 2012

(54) PIXEL STRUCTURE AND THE METHOD OF FORMING THE SAME

(75) Inventors: Ssu-Lin Yen, Taipei County (TW); Chia-Ming Chiang, Taoyuan County (TW)

(73) Assignee: Chunghwa Picture Tubes, Ltd., Bade, Taoyuan (TW)

( * ) Notice: Subject to any disclaimer, the term of this patent is extended or adjusted under 35 U.S.C. 154(b) by 285 days.

(21) Appl. No.: 12/499,752

(22) Filed: Jul. 8, 2009

(65) Prior Publication Data
US 2010/0270550 A1  Oct. 28, 2010

(30) Foreign Application Priority Data
Apr. 27, 2009  (TW) .................. 98113940 A

(51) Int. Cl.
*H01L 27/14* (2006.01)

(52) U.S. Cl. ............... 257/59; 257/72; 257/E27.132; 257/E29.117; 257/E29.151; 349/46; 349/139; 349/43

(58) Field of Classification Search ............ 257/59, 257/72, E27.132, E27.158, E27.159, E29.117, 257/E29.151; 349/43, 46, 139
See application file for complete search history.

(56) References Cited

U.S. PATENT DOCUMENTS

| | | | | |
|---|---|---|---|---|
| 5,877,512 | A * | 3/1999 | Kim ................................ | 257/57 |
| 6,747,288 | B2 * | 6/2004 | Yamazaki et al. ............. | 257/57 |
| 6,825,907 | B2 | 11/2004 | Hashiguchi | |
| 7,205,570 | B2 * | 4/2007 | Kim et al. ...................... | 257/72 |
| 7,280,168 | B2 * | 10/2007 | Ha et al. ......................... | 349/43 |
| 7,427,777 | B2 * | 9/2008 | Tsou et al. ..................... | 257/59 |
| 7,488,632 | B2 * | 2/2009 | Ahn et al. ..................... | 438/159 |
| 7,763,891 | B2 * | 7/2010 | Chang et al. ................... | 257/72 |
| 7,829,897 | B2 * | 11/2010 | Song et al. ..................... | 257/72 |
| 7,830,486 | B2 * | 11/2010 | Liu et al. ...................... | 349/143 |
| 7,956,950 | B2 * | 6/2011 | Lee et al. ....................... | 349/46 |
| 2007/0034879 | A1 * | 2/2007 | Park et al. ..................... | 257/72 |
| 2007/0181877 | A1 * | 8/2007 | Lim et al. ...................... | 257/59 |

FOREIGN PATENT DOCUMENTS
JP  11231346  8/1999

* cited by examiner

*Primary Examiner* — Colleen Matthews
*Assistant Examiner* — Galina Yushina
(74) *Attorney, Agent, or Firm* — Winston Hsu; Scott Margo

(57) ABSTRACT

A pixel structure includes a drain extension portion disposed on an islanding semiconductor layer, wherein the islanding semiconductor layer is formed together with a thin-film transistor channel layer. Therefore, the total thickness of the islanding semiconductor layer and the drain extension portion is increased, such that the distance between the gate line and the drain extension portion is enlarged, and the coupling capacitance between the gate line and the drain extension portion can be lowered. Therefore, the display panel with the pixel structure of the present invention can have low coupling capacitance so as to improve the flicker phenomena obviously.

8 Claims, 7 Drawing Sheets

PIXEL STRUCTURE AND THE METHOD OF FORMING THE SAME

BACKGROUND OF THE INVENTION

1. Field of the Invention

The present invention relates to a pixel structure and a method of forming the same, and more particularly, to a pixel structure and a method of forming the same that improves the image flicker phenomena of the display panel.

2. Description of the Prior Art

The traditional cathode ray tube (CRT) displays have been gradually replaced by the flat displays. Among the flat displays, the liquid crystal display (LCD) is a most popular flat display and widely used nowadays, and the LCD has advantages such as low weight, low power consuming and low driving voltage and can be integrated into and applied to daily products such as notebooks, digital cameras, video game machines. In the design of pixel structure of the conventional LCDs, it is a main industrial development trend to adopt thin film transistors as the driving devices. Generally speaking, the coupling capacitor effect may occur between the conductive layers of the thin film transistor and the conductive layers of other adjacent components so that the display panel will have the problem such as image flicker phenomena when displaying. With reference to FIG. 1 and FIG. 2, FIG. 1 is a top view schematic diagram illustrating a part of the pixel structure of the conventional display panel, and FIG. 2 is a cross-sectional schematic diagram of the pixel structure along the line A-A' illustrated in FIG. 1. As shown in FIG. 1 and FIG. 2, FIG. 1 and FIG. 2 illustrate the pixel structure of the conventional display panel, wherein the pixel structure 10 of the conventional display panel is defined by a source line 11 and a gate line 12, and includes a substrate 13, the source line 11, a source electrode 14, the gate line 12, and a gate electrode 15 disposed on the substrate 13, a gate dielectric layer 16 covering and disposed on the gate line 12 and the gate electrode 15, a drain electrode 17 and a drain shielding extension 18 disposed on the gate dielectric layer 16, a protection layer 19 disposed on the drain electrode 17, the drain shielding extension portion 18 and the gate dielectric layer 16, and a transparent electrode 20 disposed on the protection layer 19. However, in the pixel structure 10 of the conventional display panel, a parallel capacitor named as the first coupling capacitor $C_{gd1}$ occurs in the vertically overlapping area of the drain electrode 17 and the gate electrode 15. In another aspect, the drain shielding extension portion 18 and the adjacent gate line 12 are parallel to each other and the gate dielectric layer 16 and the insulating protection layer 19 are disposed between the drain shielding extension portion 18 and the adjacent gate line 12, so as to form a lateral capacitor named as the second coupling capacitor $C_{gd2}$. The capacitance of the first coupling capacitor $C_{gd1}$ is substantially proportioned to the overlapping area A of the drain electrode 17 and the gate electrode 15 in the vertical direction, and the capacitance of the second coupling capacitor $C_{gd2}$ is substantially proportioned to the laterally overlapping area of the drain shielding extension portion 18 and the gate line 12 and is substantially in reverse proportion to the straight distance P between the drain shielding extension portion 18 and the gate line 12. Conventionally, the design of thin film transistor channel of pixel structures of the conventional large-size LCD panel is large. As a result, if only the first coupling capacitor $C_{gd1}$ formed in the overlapping area A of the gate electrode 15 and the drain electrode 17 in the vertical direction is considered and listed for calculation, the influence upon the deviation of the total coupling capacitance is small oppositely. On the contrary, in the design of the pixel structure of small-size or middle-size LCD panels, since the channel width of the thin film transistor is shortened obviously, the signal interference resulted from the second coupling capacitor $C_{gd2}$ will become obvious when the pixel structure of the display panel being operated so that the flicker phenomena of the display panel will become seriously and can not be ignored.

Form the above description, the pixel structure of the conventional LCD panel has a high coupling capacitor effect, such that the display panel easily has the flicker phenomena when displaying images. Consequently, to develop a display panel pixel structure having low flicker phenomena is an important research object for display industry.

SUMMARY OF THE INVENTION

One object of the present invention is to provide a pixel structure and a method of forming the pixel structure so that the coupling capacitor effect between the gate line and the drain extension portion can be effectively reduced so as to achieve the goal for improving the flicker phenomena of the display panel.

In order to achieve the above-mentioned object, the present invention proposes a pixel structure. The pixel structure includes a substrate, a patterned first conductive layer disposed on the substrate, a gate dielectric layer disposed on the patterned first conductive layer, a patterned semiconductor layer disposed on a part of the gate dielectric layer, a patterned second conductive layer disposed on a part of the patterned semiconductor layer, a protection layer disposed on the substrate, and a patterned third conductive layer disposed on the protection layer. The patterned first conductive layer includes at least a gate line substantially disposed along a first direction and at least a gate electrode electrically connected to the gate line. The patterned semiconductor layer includes a thin film transistor channel layer and an islanding semiconductor layer that is substantially parallel to the first direction. The patterned second conductive layer includes a source line, a source electrode, and a drain electrode covering a part of the thin film transistor channel layer, and a drain extension portion covering a part of the islanding semiconductor layer. The protection layer covers the patterned second conductive layer, a part of the patterned semiconductor layer, and a part of the gate dielectric layer. The patterned third conductive layer is electrically connected to the drain electrode.

In order to achieve the above-mentioned object, the present invention proposes a method of forming a pixel structure. The method includes following steps: a substrate is provided; a patterned first conductive layer is formed on the surface of the substrate, wherein the patterned first conductive layer comprises at least a gate line and at least a gate electrode; a gate dielectric layer is formed on the surface of the substrate to cover the gate line and the substrate; a patterned semiconductor layer is formed on the gate dielectric layer, which includes a thin film transistor channel layer and a islanding semiconductor layer, and the extending direction of the islanding semiconductor layer is substantially parallel to the extending direction of the gate line; a patterned second conductive layer is formed on the surface of the substrate, wherein the patterned second conductive layer includes a source line, a source electrode, a drain electrode, and a drain extension portion, at least a part of the drain extension portion covers the surface of the islanding semiconductor layer, and the extending direction of the drain extension portion is substantially parallel to the extending direction of the islanding semiconductor layer; a protection layer is formed on the patterned second conductive layer, and the protection layer covers a part of the gate dielectric layer, a part of the patterned semiconductor layer, and the patterned second conductive layer; and a patterned third conductive layer is formed on the protection layer, wherein the patterned third conductive covers the protection layer, the patterned third conductive layer is electrically connected to the drain electrode, and at least a part of the patterned third conductive layer and the islanding semiconductor layer vertically overlaps with each other.

The advantage of the pixel structure of the present invention includes forming the thin film transistor channel layer and the islanding semiconductor layer at the same time and stacking the drain extension portion on the islanding semiconductor layer. Therefore, the total thickness of the islanding semiconductor layer and the drain extension portion stacked together increases. In such a case, the straight distance between the gate line and the drain extension portion is enlarged so as to lower the coupling capacitor effect of the gate line and the drain extension portion for effectively improving the flicker phenomena of the display panel. Besides, the method of forming the pixel structure of the present invention has advantages that it is not needed to adjust the aperture ratio, use any additional photomask, or perform extra fabrication process. Consequently, the forming of the pixel structure of the present invention can be easily performed in practice by virtue of the traditional photomask module.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". In addition, the term "electrically connected" includes any directly or indirectly electrical connection methods. Therefore, if the description in the following paragraphs is that a first device is electrically connected to a second device, the aforementioned words stand for that the first device can be electrically connected to the second device directly or be electrically connected to the second device indirectly by means of other devices or electrical connection methods.

Figure 1:
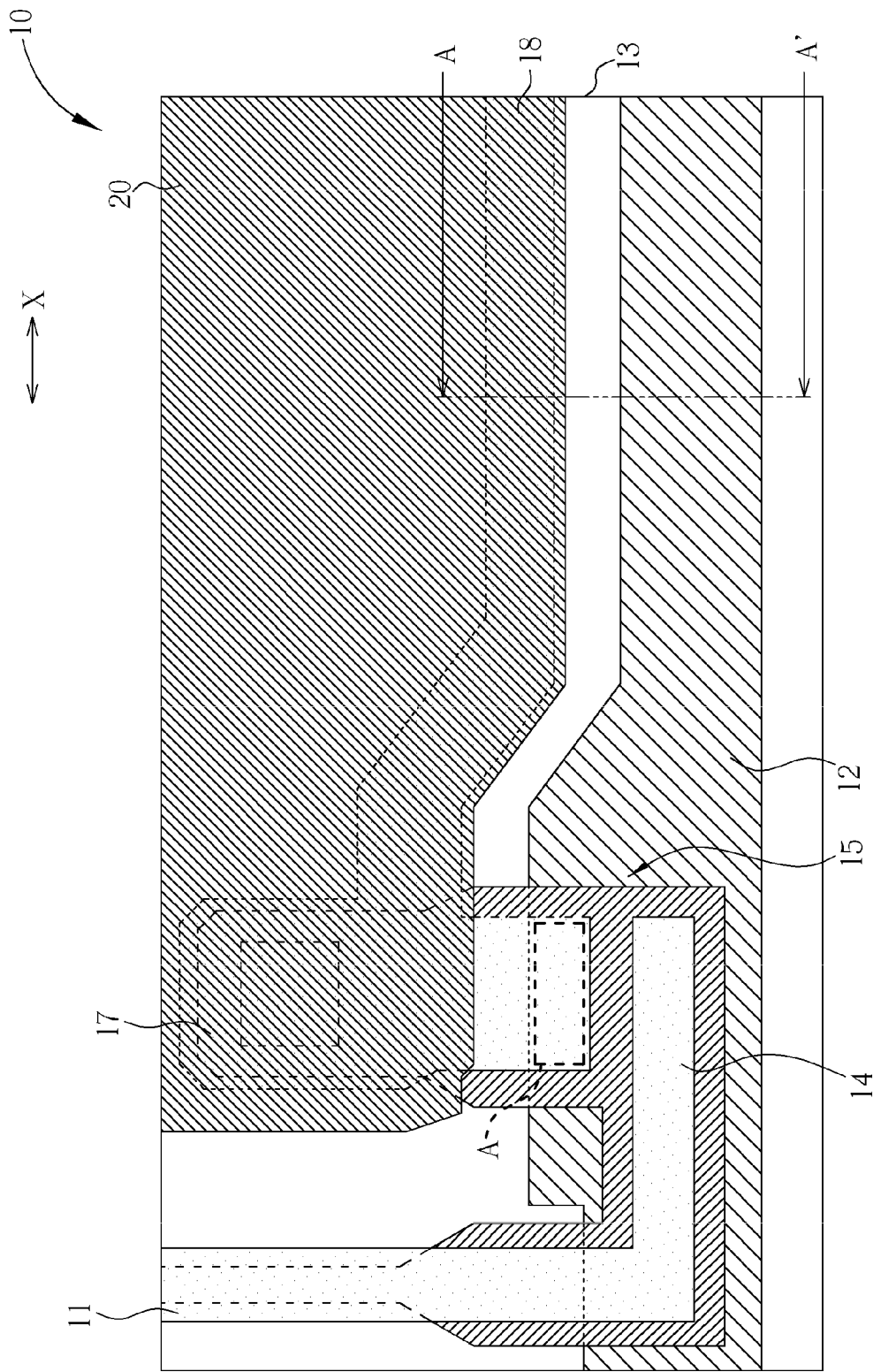
FIG. 1 is a top view schematic diagram illustrating a part of the pixel structure of the conventional display panel.
Figure 2:
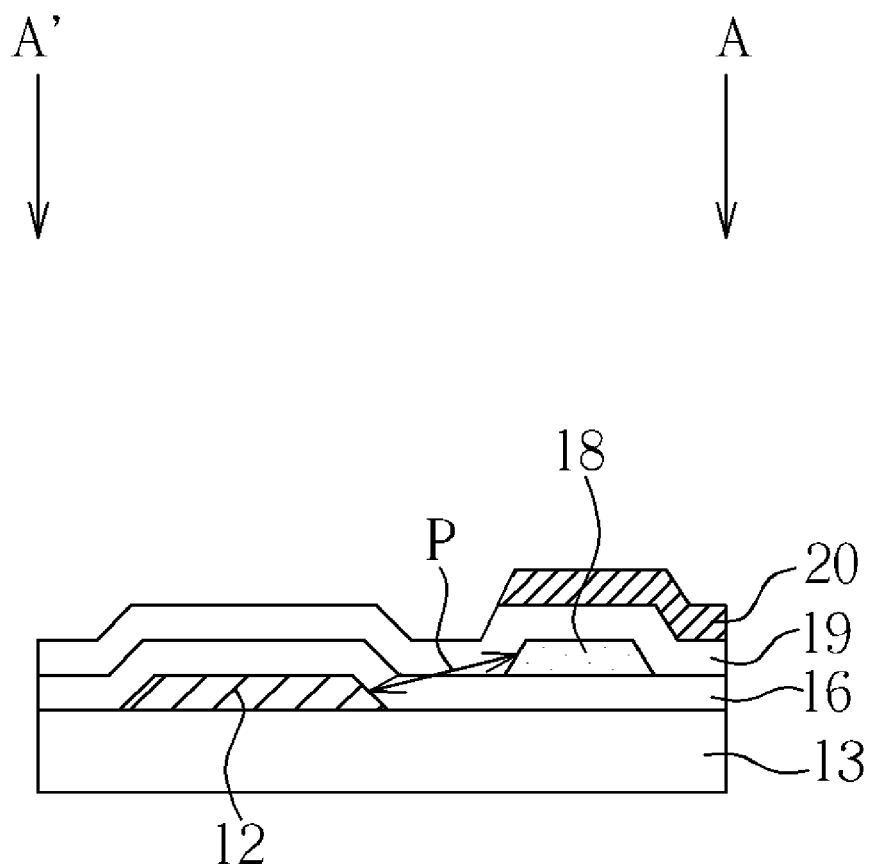
FIG. 2 is a cross-sectional schematic diagram of the pixel structure along the line A-A' illustrated in FIG. 1.
Figure 3:
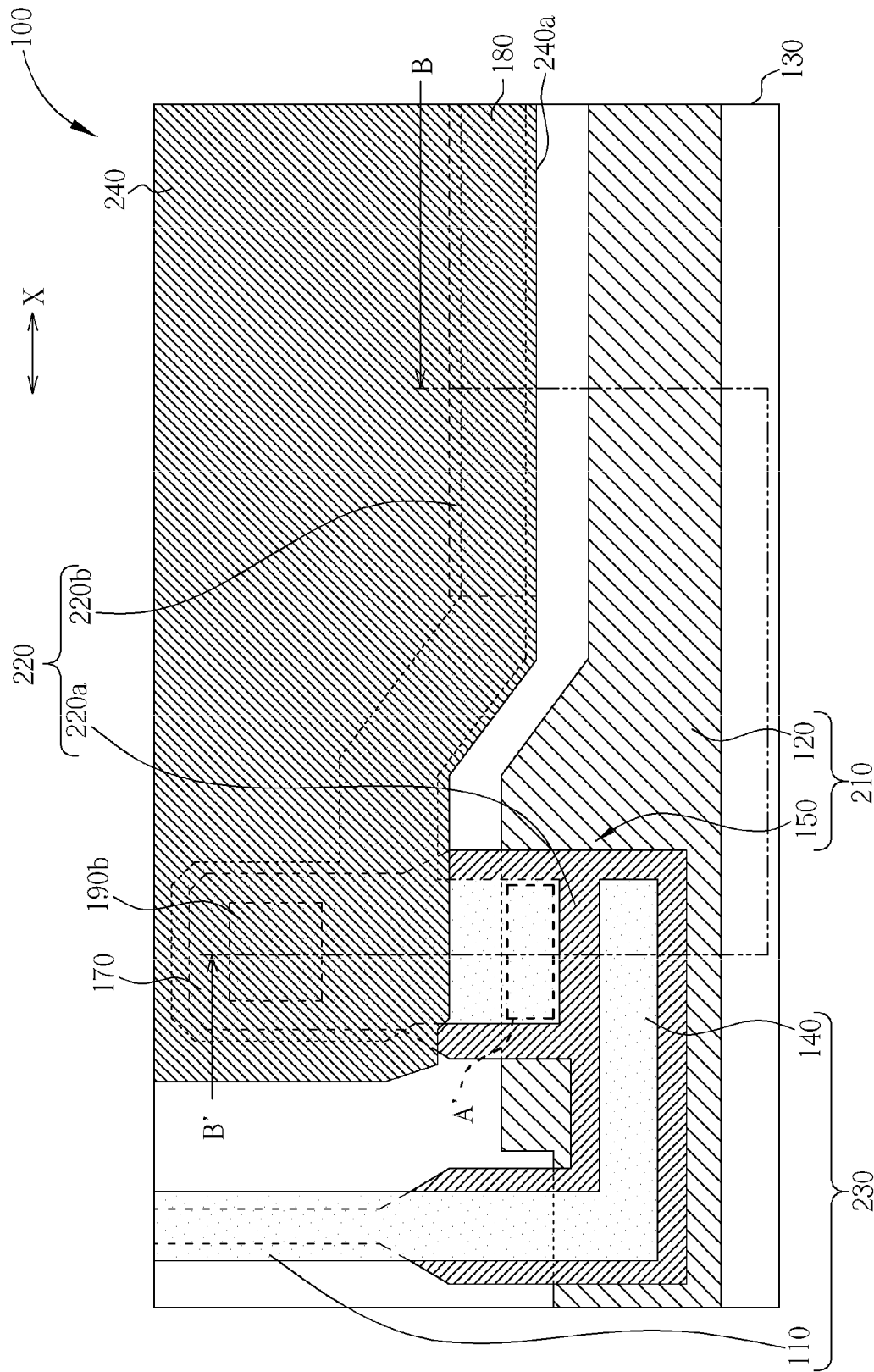
FIG. 3 is a schematic diagram illustrating a preferred embodiment of the pixel structure of the present invention.
Figure 4:
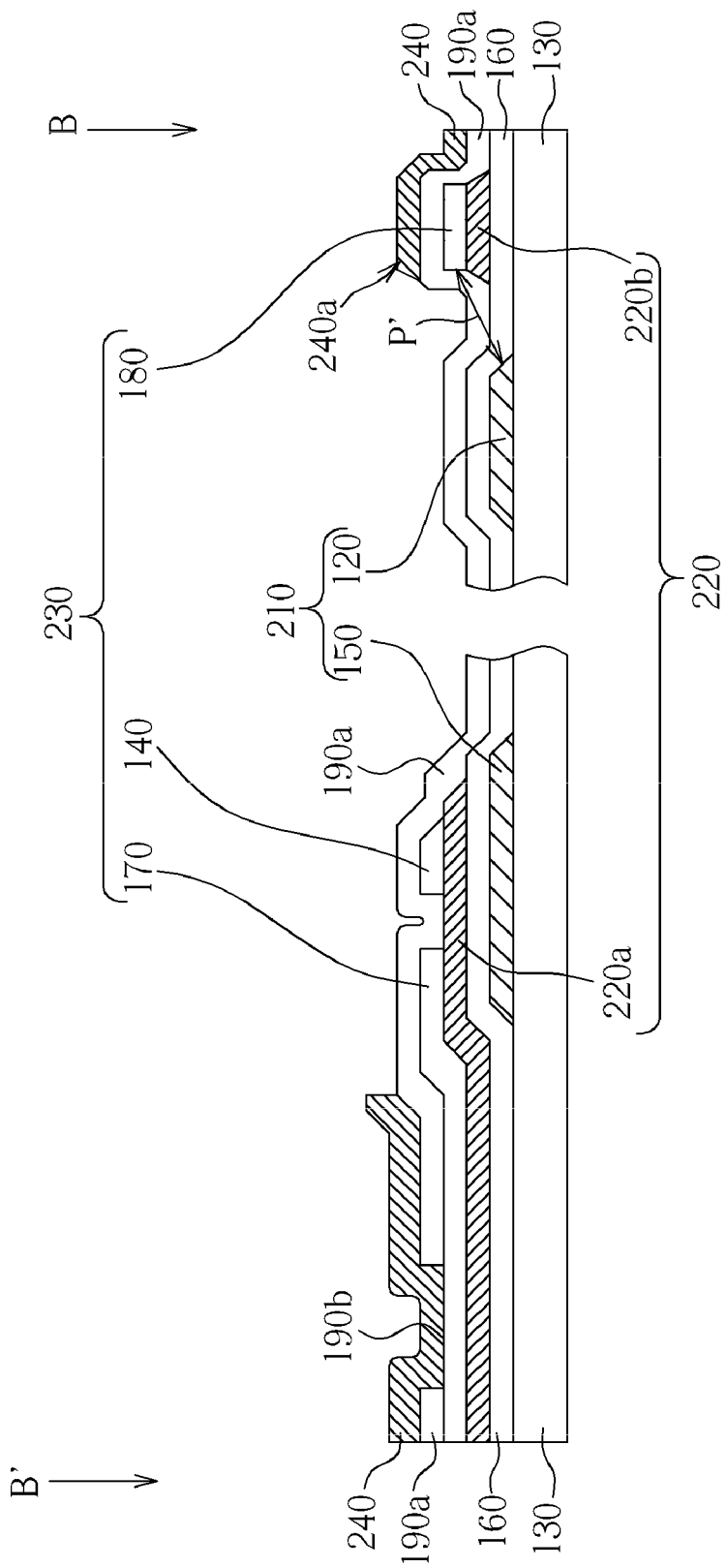
FIG. 4 is a cross-sectional schematic diagram of the pixel structure along the line B-B' illustrated in FIG. 3.

With reference to FIG. 3 and FIG. 4, FIG. 3 is a schematic diagram illustrating a preferred embodiment of the pixel structure of the present invention, and FIG. 4 illustrates a cross-sectional schematic diagram of the pixel structure along the line B-B' illustrated in FIG. 3. In order to clearly describe the structure of the present invention, FIG. 3 and FIG. 4 should be referred together. The pixel structure 100 of the present invention includes a substrate 130, a patterned first conductive layer 210 disposed on the substrate 130, a gate dielectric layer 160 disposed on the patterned first conductive layer 210, a patterned semiconductor layer 220 disposed on a part of the gate dielectric layer 160, a patterned second conductive layer 230 disposed on a part of the patterned semiconductor layer 220, a protection layer 190a, a contact hole 190b, and a patterned third conductive layer 240 disposed on a part of the protection layer 190a. In this embodiment, as illustrated in FIG. 3, the patterned first conductive layer 210 includes at least a gate line 120 substantially extends along the first direction X and at least a gate electrode 150 electrically connected to the gate line 120. The patterned semiconductor 220 includes a thin film transistor channel layer 220a and a islanding semiconductor layer 220b, the islanding semiconductor layer 220b is substantially parallel to the first direction X, and the thickness of the thin film transistor channel layer 220a is substantially equal to the thickness of the islanding semiconductor layer 220b. However, the thickness of the thin film transistor channel layer 220a and the thickness of the islanding semiconductor layer 220b can be adjusted respectively if needed and do not have any particular limitation. The patterned second conductive layer 230 includes a source line 110, a source electrode 140, a drain electrode 170, and a drain extension portion 180. The source electrode 140 and the drain electrode 170 cover a part of the thin film transistor channel layer 220a, and the drain extension portion 180 covers a part of the islanding semiconductor layer 220b and is disposed substantially parallel to the first direction. Besides, the protection layer 190a covers the patterned second conductive layer 230, the patterned semiconductor layer 220, and the gate dielectric layer 160, and the contact hole 190b is disposed in the protection layer 190a so that the protection layer 190a can expose a part of the drain electrode 170. The patterned third conductive layer 240 is disposed on the protection layer 190a, a part of the patterned third conductive layer 240 is formed in the contact hole 190b and is electrically connected to the drain electrode 170, and the patterned third conductive layer 240 is preferably formed by transparent material. In addition, the spatial arrangement of the pixel structure 100 of the present invention has following characteristics. The extending direction of the drain extension portion 180 is substantially parallel to the extending direction of the islanding semiconductor layer 220b and the drain extension portion 180 covers and overlaps the islanding semiconductor layer 220b. The extending direction of the islanding semiconductor layer 220b is substantially parallel to the extending direction (it is therefore the first direction X) of the gate line 120, and at least a part of the patterned third conductive layer 240 and the islanding semiconductor layer 220b vertically overlap with each other. In addition, the patterned third conductive layer 240 has an edge 240a disposed in parallel to and adjacent to a part of the gate line 120, and the islanding semiconductor layer 220b is disposed under a part of the edge 240a. It is therefore the extending direction of the islanding semiconductor layer 220b is parallel to both the drain extension portion 180 and the adjacent gate line 120. In the pixel structure 100 of the present invention, the drain electrode 170 and the gate electrode 150 have an overlapping area A' in the vertical direction, and a gate dielectric layer 160 is disposed between the drain electrode 170 and the gate electrode 150. Consequently, in the overlapping area A', a first coupling capacitor $C_{gd1}'$ occurs.

When viewing the cross-sectional diagram of the pixel structure 100 of the present invention, the cross-sectional structure in the vertical direction illustrated in FIG. 4 can be referred. Since the drain extension portion 180 and a part of the gate line 120 have an overlapping area in the lateral direction and have a gate dielectric layer 160 and a protection layer 190a disposed therebetween, the drain extension portion 180 and a part of the gate line 120 will have a second coupling capacitor $C_{gd2}'$ in the lateral direction. It should be noted that the drain extension portion 180 of the pixel structure 100 of the present invention is stacked on the islanding semiconductor layer 220b so as to increase the straight distance P' between the drain extension portion 180 and the gate line 120. Consequently, the straight distance P' of the pixel structure 100 of the present invention is larger than the straight line P of the pixel structure 10 of the conventional display panel. It is therefore that the second coupling capacitor $C_{gd2}'$ of the pixel structure 100 of the present invention can be smaller than the second coupling capacitor $C_{gd2}$ of the pixel structure 10 of the conventional display panel.

In addition, as illustrated in FIG. 3, in this embodiment, the patterned first conductive layer 210 and the second patterned semiconductor 230 can include, but not limited to, metal material for example; the patterned semiconductor layer 220 may be made of material such as, but not limited to, amorphous silicon, polysilicon, complex compound, and organic semiconductor; the patterned third conductive layer 240 may be made of a transparent conductive material such as indium tin oxide or indium zinc oxide, but not limited to, and the transparent conductive material can include other conductive materials; the gate dielectric layer 160 can be materials such as silicon oxide ($SiO_2$) or silicon nitride ($SiN_x$), but is not limited; the protection layer 190a can be materials such as silicon nitride ($Si_3N_4$), but is not limited.

Figure 5A:
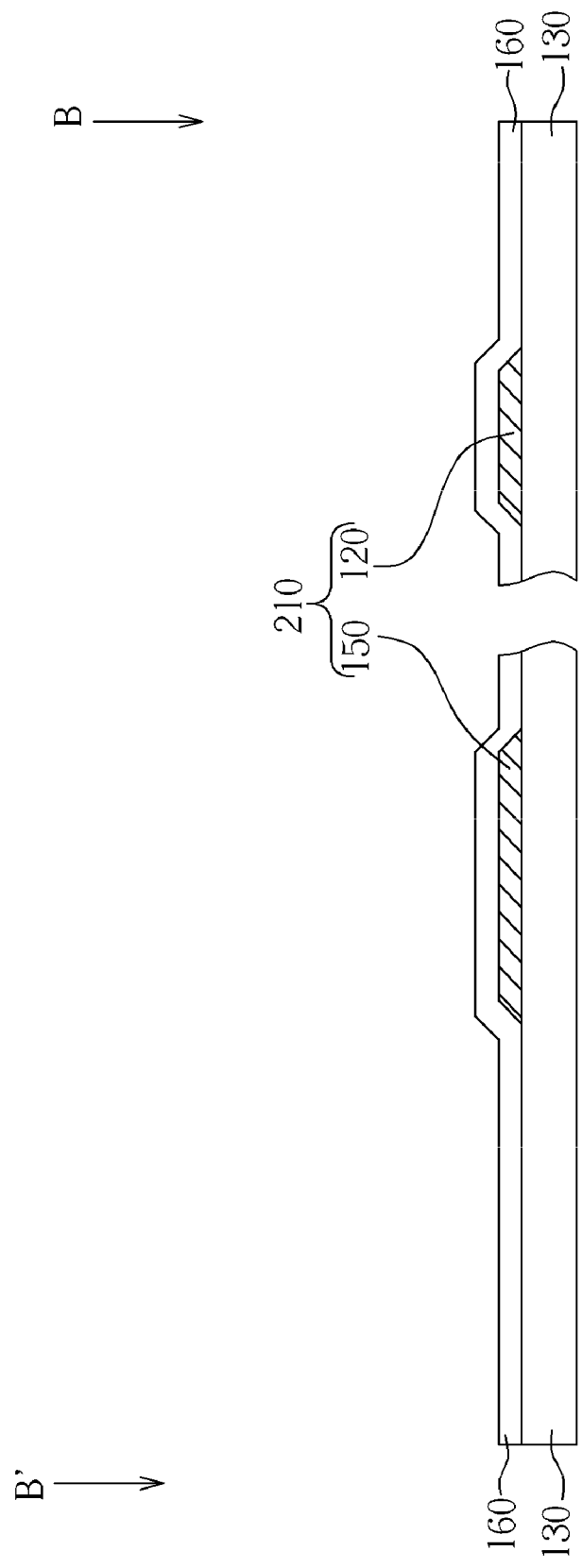
FIG. 5a to FIG. 5c are schematic diagrams illustrating the method of forming the pixel structure of the present invention.
Figure 5B:
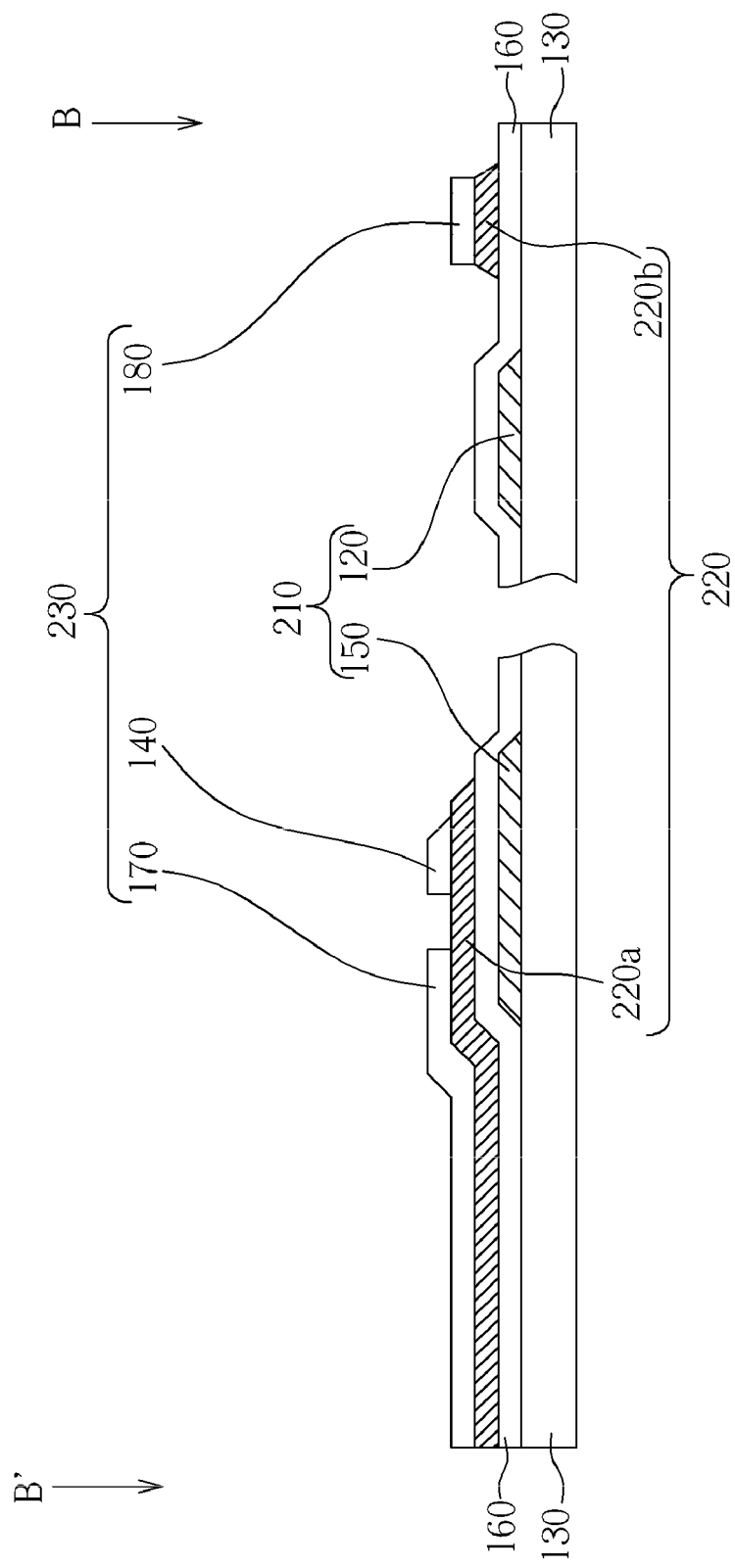
Figure 5C:
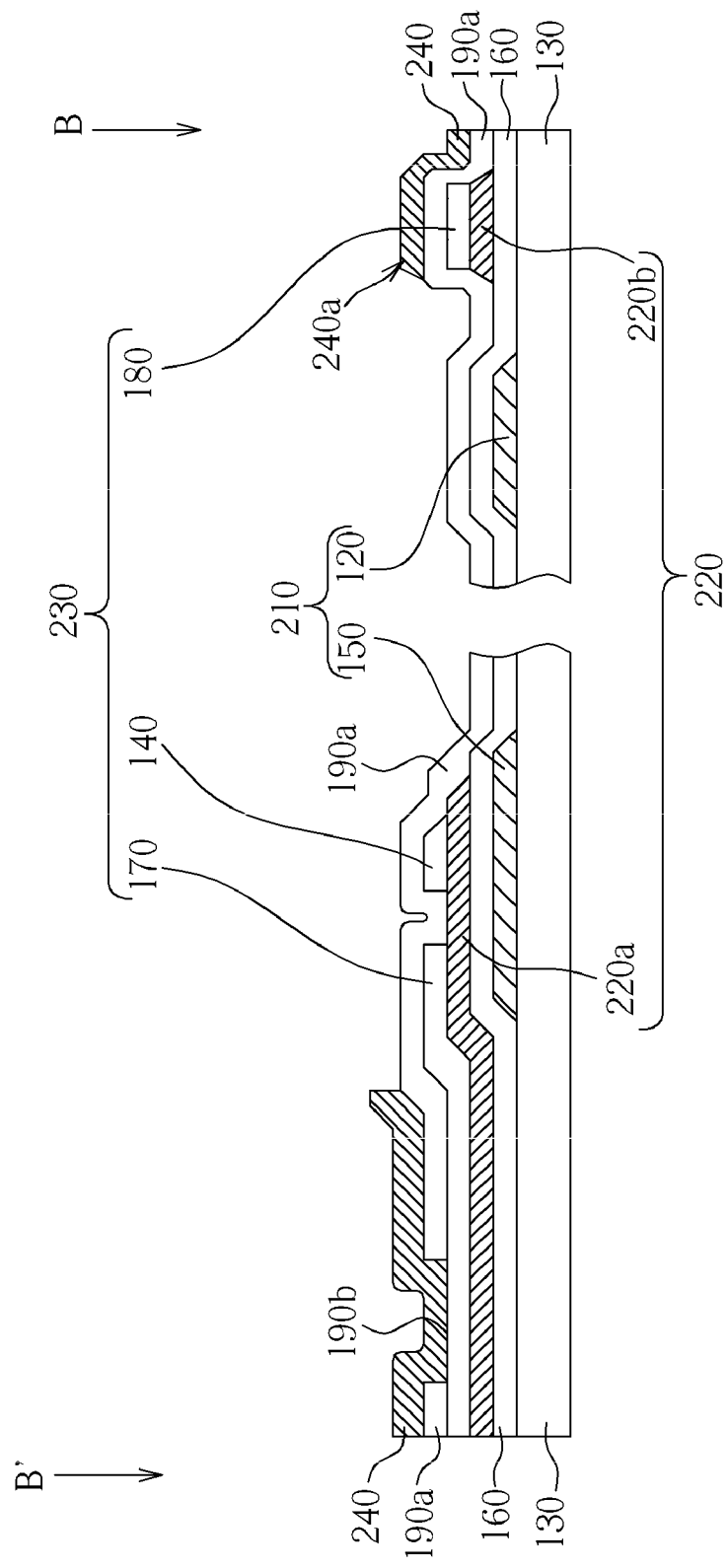

With reference to FIG. 5a to FIG. 5c, FIG. 5a to FIG. 5c are schematic diagrams illustrating the method of forming the pixel structure 100 of the present invention. As illustrated in FIG. 5a, firstly, a conductive layer such as a metal layer is formed on the substrate 130. Afterwards, the conductive layer disposed on the substrate 130 is processed so as to form a patterned first conductive layer 210 by utilizing a first photomask, and the patterned first conductive layer 210 includes at least a gate line 120 and at least a gate electrode 150. After that, a gate dielectric layer 160 is formed on the surface of the substrate 130, and the gate dielectric layer 160 substantially covers the patterned first conductive layer 210 and the substrate 130. As illustrated in FIG. 5b, a second photomask is subsequently used to form a patterned semiconductor layer 220 on the gate dielectric layer 160, and the patterned semiconductor layer 220 includes a thin film transistor channel layer 220a and a islanding semiconductor layer 220b. A part of the thin film transistor channel layer 220a is disposed on the gate electrode 150. It should be noted that the extending direction of the islanding semiconductor layer 220b of the method is substantially parallel to the extending direction of the gate line 120 as illustrated in FIG. 3. Afterwards, a third photomask is utilized to form a patterned second conductive layer 230 on the surface of the substrate 130, and the patterned second conductive layer 230 includes a source line (not shown in FIG. 5b), a source electrode 140, a drain electrode 170, and a drain extension portion 180. At least a part of the drain shielding portion 180 covers the surface of the islanding semiconductor layer 220b. As illustrated in FIG. 3, it should be noted that the extending direction of the drain extension portion 180 of the present invention is substantially parallel to the extending direction of the islanding semiconductor layer 220b and the gate line 120. As illustrated in FIG. 5c, a fourth photomask is subsequently utilized to form a protection layer 190a and a contact hole 190b on the patterned second conductive layer 230, and the protection layer 190a covers the gate dielectric layer 160, the patterned semiconductor layer 220 and a part of the patterned second conductive layer 230. Finally, a fifth photomask is utilized to form a patterned third conductive layer 240 on the protection layer 190a, wherein the patterned third conductive layer 240 covers a part of the protection layer 190a, and a part of the patterned third conductive layer 240 is formed in the contact hole 190b and electrically connected to the drain electrode 170. Besides, in the aforementioned steps of the method of forming the pixel structure 100 of the present invention, the steps of forming the patterned first conductive layer 210, the patterned semiconductor layer 220, the protection layer 190a, the patterned second conductive layer 230, and the patterned third conductive layer 240 comprise a patterning process respectively, such as a photolithography-etching process, but is not limited. It is therefore that the patterning processes can be various and have no particular limitation. Furthermore, the gate dielectric layer 160 and the protection layer 190a are formed respectively through a deposition process such as, but not limited to, a chemical vapor deposition (CVD) and physical vapor deposition (PVD). In another words, the gate dielectric layer 160 and the protection layer 190a can be formed by other deposition processes.

It should be noted that when forming the semiconductor layer according to the present invention, a islanding semiconductor layer is skillfully formed together with the thin film transistor channel layer at the same time. After that, the drain extension portion is stacked and formed on the islanding semiconductor layer so that the straight distance between the drain extension portion and the gate line are obviously increased so as to effectively lower the capacitance of the lateral coupling capacitor between the drain extension portion and the gate line in the lateral direction. From aforementioned description, the pixel structure and the method of forming the pixel structure of the present invention can be performed to effectively improve the flicker phenomena of the display panel.

The pixel structure of the present invention comprises a thin film transistor channel layer and a islanding semiconductor layer formed at the same time and a drain extension portion subsequently stacked on the islanding semiconductor layer. Therefore, the total thickness of the stacked islanding semiconductor layer and the drain extension portion is increased. In such a case, the straight distance between the gate line and the drain extension portion is enlarged so as to lower the lateral coupling capacitor effect of the gate line and the drain extension portion, which effectively improves the flicker phenomena of the display panel.

In summary, the pixel structure and the method of forming the pixel structure have following advantages:

The pixel structure of the present invention comprises a thin film transistor channel layer and a floating semiconductor layer formed at the same time and a drain shielding extension portion subsequently stacked on the floating semiconductor layer. Therefore, the total thickness of the stacked floating semiconductor layer and the drain shielding extension portion is increased. In such a case, the straight distance between the gate line and the drain shielding extension portion is enlarged so as to lower the lateral coupling capacitor effect of the gate line and the drain shielding extension portion, which effectively improves the flicker phenomena of the display panel.

The method of forming the pixel structure of the present invention has advantages that the aperture ratio can not be adjusted and extra photomask or patterning processes are not needed. Consequently, the forming of the pixel structure of the present invention can be easily integrated into the conventional thin film transistor manufacturing process in practice. In other words, the conventional pixel structure manufacturing process can be directly utilized to achieve the object of improving the display images of the flat display panels.

Those skilled in the art will readily observe that numerous modifications and alterations of the device and method may be made while retaining the teachings of the invention.

What is claimed is:

1. A pixel structure, comprising:
a substrate;
a patterned first conductive layer disposed on the substrate, comprising:
at least a gate line substantially disposed along a first direction; and
at least a gate electrode extended from the gate line;
a gate dielectric layer disposed on the patterned first conductive layer;
a patterned semiconductor layer disposed on a part of the gate dielectric layer, comprising:
a thin film transistor channel layer; and
an islanding semiconductor layer not overlapping with the patterned first conductive layer disposed substantially parallel to the first direction;
a patterned second conductive layer disposed on a part of the patterned semiconductor layer, comprising:
a source line;
a source electrode and a drain electrode covering parts of the thin film transistor channel layer; and
a drain extension portion covering a part of the islanding semiconductor layer, the drain extension portion and the drain electrode forming a continuous structure;
a protection layer disposed on the substrate, the protection layer covering the patterned second conductive layer, a part of the patterned semiconductor layer, and a part of the gate dielectric layer; and
a patterned third conductive layer disposed on the protection layer and electrically connected to the drain electrode, wherein the patterned third conductive layer has an edge disposed parallel and adjacent to a part of the gate line, and the islanding semiconductor layer is disposed under a part of the edge.

2. The pixel structure of claim 1, wherein the patterned first conductive layer comprises a metal material.

3. The pixel structure of claim 1, wherein the patterned second conductive layer comprises a metal material.

4. The pixel structure of claim 1, wherein a thickness of the thin film transistor channel layer is substantially equal to a thickness of the islanding semiconductor layer.

5. The pixel structure of claim 1, wherein at least a part of the drain extension portion covers a surface of the islanding semiconductor layer.

6. The pixel structure of claim 1, wherein an extending direction of the drain extension portion is substantially parallel to an extending direction of the islanding semiconductor layer.

7. The pixel structure of claim 1, wherein an extending direction of the islanding semiconductor layer is substantially parallel to an extending direction of the gate line.

8. The pixel structure of claim 1, wherein at least a part of the patterned third conductive layer and the islanding semiconductor layer vertically overlap with each other.

* * * * *